(12) United States Patent
Jyousaka et al.

(10) Patent No.: US 7,910,863 B2
(45) Date of Patent: Mar. 22, 2011

(54) TEMPERATURE SETTING METHOD OF THERMAL PROCESSING PLATE, COMPUTER-READABLE RECORDING MEDIUM RECORDING PROGRAM THEREON, AND TEMPERATURE SETTING APPARATUS FOR THERMAL PROCESSING PLATE

(75) Inventors: Megumi Jyousaka, Koshi (JP); Hiroshi Tomita, Koshi (JP); Masahide Tadokoro, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 11/858,809

(22) Filed: Sep. 20, 2007

(65) Prior Publication Data

US 2009/0078695 A1    Mar. 26, 2009

(51) Int. Cl.
    H05B 1/02  (2006.01)
(52) U.S. Cl. .................. 219/482; 219/494; 392/418
(58) Field of Classification Search ............... 219/444.1, 219/482, 483, 490, 494; 700/207, 300; 396/578, 396/626
See application file for complete search history.

(56) References Cited

U.S. PATENT DOCUMENTS

| | | | | |
|---|---|---|---|---|
| 6,402,509 | B1 * | 6/2002 | Ookura et al. | 432/253 |
| 6,457,882 | B2 * | 10/2002 | Ogata et al. | 396/578 |
| 7,049,553 | B2 * | 5/2006 | Shigetomi et al. | 219/482 |
| 2004/0186622 | A1 * | 9/2004 | Aiuchi et al. | 700/241 |
| 2004/0250762 | A1 * | 12/2004 | Shigetomi et al. | 118/684 |
| 2005/0188341 | A1 * | 8/2005 | Fukuhara et al. | 716/19 |

FOREIGN PATENT DOCUMENTS

| | | |
|---|---|---|
| JP | 2001-143850 | 5/2001 |
| JP | 2004-79586 | 3/2004 |
| JP | 2004-179663 | 6/2004 |
| JP | 2007-227570 | 9/2007 |

OTHER PUBLICATIONS

Office Action issued Sep. 7, 2010, in Japanese Patent Application No. 2006-141351 (with English-language translation).

* cited by examiner

*Primary Examiner* — Mark H Paschall
*Assistant Examiner* — Brian Jennison
(74) *Attorney, Agent, or Firm* — Oblon, Spivak, McClelland, Maier & Neustadt, L.L.P.

(57) ABSTRACT

A thermal plate of a PEB unit is divided into a plurality of thermal plate regions, and a temperature is settable for each of the thermal plate regions. A temperature correction value for adjusting the temperature within the thermal plate is settable for each of the thermal plate regions of the thermal plate. The line widths within the substrate for which a photolithography process has been finished are measured. The in-plane tendency of the measured line widths is decomposed into a plurality of in-plane tendency components using a Zernike polynomial. Then, in-plane tendency components improvable by setting the temperature correction values are extracted from the calculated plurality of in-plane tendency components and added to calculate an improvable in-plane tendency in the measured line widths. Then, the improvable in-plane tendency is subtracted from the in-plane tendency Z of the current processing states to calculate an after-improvement in-plane tendency.

9 Claims, 10 Drawing Sheets

IN-PLANE TENDENCY Z OF
MEASURED LINE WIDTHS

DECOMPOSITION

FIG.10
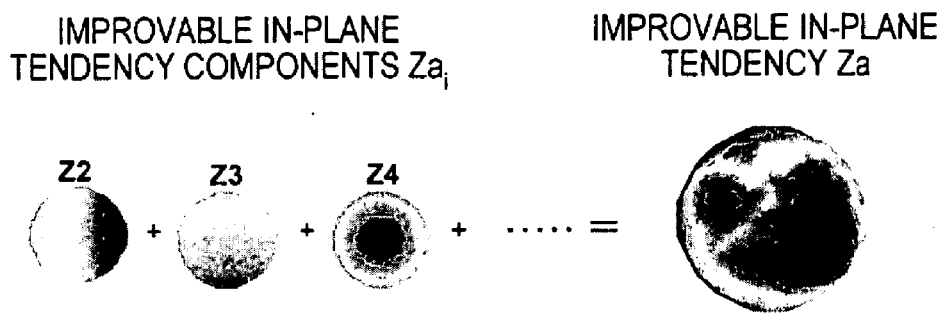
FIG.11
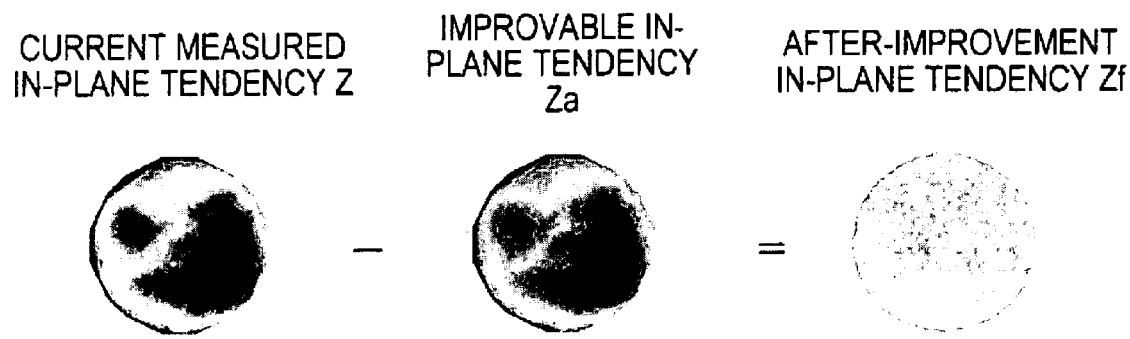
FIG.12
$$M = \begin{pmatrix} M_{11}, M_{12}, & \cdots & M_{1m} \\ M_{21}, M_{22}, & \cdots & M_{2m} \\ \vdots & \ddots & \vdots \\ M_{n1}, M_{n2}, & \cdots & M_{nm} \end{pmatrix}$$

FIG.13

```
MEASURE LINE WIDTHS OF RESIST PATTERN      ~ S1
         WITHIN WAFER
                  ↓
DECOMPOSE MEASURED IN-PLANE TENDENCY Z
INTO IN-PLANE COMPONENTS USING ZERNIKE      ~ S2
              POLYNOMIAL
                  ↓
ADD UP IMPROVABLE IN-PLANE COMPONENTS
   TO CALCULATE IMPROVABLE IN-PLANE         ~ S3
              TENDENCY Za
                  ↓
SUBTRACT IMPROVABLE IN-PLANE TENDENCY
Za FROM CURRENT MEASURED IN-PLANE           ~ S4
TENDENCY Z TO CALCULATE AFTER-
IMPROVEMENT IN-PLANE TENDENCY Zf
                  ↓
  CALCULATE TEMPERATURE CORRECTION          ~ S5
   VALUES USING CALCULATION MODEL M
                  ↓
   SET TEMPERATURE CORRECTION VALUES        ~ S6
```

FIG.14

$$\begin{pmatrix} \Delta T_1 \\ \Delta T_2 \\ \Delta T_3 \\ \Delta T_4 \\ \Delta T_5 \end{pmatrix} = M^{-1} \begin{pmatrix} 0 \\ -Za_2 \\ -Za_3 \\ \vdots \\ 0 \\ -Za_i \\ 0 \\ \vdots \end{pmatrix} \quad \cdots\cdots (2)$$

TEMPERATURE SETTING METHOD OF THERMAL PROCESSING PLATE, COMPUTER-READABLE RECORDING MEDIUM RECORDING PROGRAM THEREON, AND TEMPERATURE SETTING APPARATUS FOR THERMAL PROCESSING PLATE

BACKGROUND OF THE INVENTION

1. Field of the Invention

The present invention relates to a temperature setting method of a thermal processing plate, a computer-readable recording medium recording a program thereon, and a temperature setting apparatus for a thermal processing plate.

2. Description of the Related Art

In a photolithography process in manufacturing, for example, a semiconductor device, for example, a resist coating treatment of applying a resist solution onto a wafer to form a resist film, exposure processing of exposing the resist film into a predetermined pattern, heating processing of accelerating the chemical reaction in the resist film after exposure (post-exposure baking), and developing treatment of developing the exposed resist film are performed in sequence, so that the series of wafer processing forms a predetermined resist pattern on the wafer.

For example, the heating processing such as the above-described post-exposure baking is usually performed in a heating processing apparatus. The heating processing apparatus includes a thermal plate for mounting and heating the wafer thereon. The thermal plate has a heater embedded therein which generates heat by power feeding, and the heat generated by the heater adjusts the thermal plate to a predetermined temperature.

The thermal processing temperature in the above-described heating processing greatly affects the line width of the resist pattern to be finally formed on the wafer. Hence, to strictly control the temperature within the wafer during heating, the thermal plate of the above-described heating processing apparatus is divided into a plurality of regions, and an independent heater is embedded in each of the regions to adjust the temperature for each of the regions.

It is known that if the temperature adjustment for all of the regions of the above-described thermal plate is performed at the same set temperature, the temperature may vary within the wafer on the thermal plate, for example, due to the difference in thermal resistance between the regions, resulting in variations in the line width of the resist pattern. For this reason, a temperature correction value (a temperature offset value) is further set for each of the regions of the thermal plate to finely adjust the in-plane temperature of the thermal plate (see Japanese Patent Application Laid-open No. 2001-143850).

For setting the above-described temperature correction value, the current line widths within the wafer are first measured, and an operator sets appropriate temperature correction values according to empirical rule based on measurement values. Thereafter, the line widths within the wafer are measure again, and the operator changes the temperature correction values in consideration of the line width measurement results. After operations of the line width measurement and the change of the temperature correction values are repeated through a try and error process, the setting of the temperature correction values comes to ends at a point in time when the operator judges that the line widths have reached an appropriate line width.

However, since the temperature correction values are determined after each of the temperature correction values is changed many times through a try and error process in the above-described temperature setting, it takes a very long time to complete the operation of temperature setting. Further, it is difficult to judge whether or not the temperature correction values at a point in time are optimal values to provide the best line widths halfway through the temperature setting operation, and therefore it is necessary to end the temperature setting operation at the point in time when the operator presumes that the line widths are appropriate by his/her subjectivity. As a result, an appropriate temperature setting may not have been made, thus causing large variations in line width within the wafer.

SUMMARY OF THE INVENTION

The present invention has been developed in consideration of the above points, and its object is to perform temperature setting of a thermal processing plate such as a thermal plate in a short time and properly.

To achieve the above object, the present invention is a temperature setting method of a thermal processing plate for mounting and thermally processing a substrate thereon, the thermal processing plate being divided into a plurality of regions, and a temperature being settable for each of the regions, and a temperature correction value for adjusting an in-plane temperature of the thermal processing plate being settable for each of the regions of the thermal processing plate. The method includes the steps of: decomposing an in-plane tendency of current processing states within the substrate for which a series of substrate processing including the thermal processing has been finished, into a plurality of in-plane tendency components using a Zernike polynomial; calculating an improvable in-plane tendency of the processing states of the substrate by adding up in-plane tendency components improvable by setting the temperature correction values for the regions of the plurality of in-plane tendency components; and calculating an in-plane tendency of the processing states after improvement by subtracting the improvable in-plane tendency from the in-plane tendency of the current processing states.

According to the present invention, a plurality of in-plane tendency components of the current substrate processing states are calculated using a Zernike polynomial, and in-plane tendency components improvable by setting temperature correction values of the plurality of in-plane tendency components are added together to calculate an improvable in-plane tendency of the current processing states. Then, the improvable in-plane tendency is subtracted from the in-plane tendency of the current processing states to calculate an after-improvement in-plane tendency.

In this case, the optimal in-plane tendency which can be maximally improved by setting the temperature correction values can be recognized, so that the temperature of the thermal processing plate can be set with the optimal in-plane tendency as a target, thus significantly decreasing the time required for the temperature setting of the thermal processing plate as compared to that in the prior art. Further, since the optical in-plane tendency is known, the appropriate temperature setting can be stably performed irrespective of the level of skill of an operator.

The necessary steps of the above method may be embodied, for example, as a computer program running on a controller for controlling a temperature setting of a thermal processing plate for mounting and thermally processing a substrate thereon. The present invention according to another aspect is a computer-readable recording medium recording such a computer program thereon.

The present invention according to another aspect is a temperature setting apparatus for a thermal processing plate for mounting and thermally processing a substrate thereon, the thermal processing plate being divided into a plurality of regions, and a temperature being settable for each of the regions, and a temperature correction value for adjusting an in-plane temperature of the thermal processing plate being settable for each of the regions of the thermal processing plate. The temperature setting apparatus of the present invention includes a controller for decomposing an in-plane tendency of processing states of a substrate, from current processing states within the substrate for which a series of substrate processing including the thermal processing has been finished, into a plurality of in-plane tendency components using a Zernike polynomial; calculating an improvable in-plane tendency of the processing states of the substrate by adding up in-plane tendency components improvable by setting the temperature correction values for the regions of the plurality of in-plane tendency components; and calculating an in-plane tendency of the processing states after improvement by subtracting the improvable in-plane tendency from the in-plane tendency of the current processing states.

According to the present invention, the temperature setting of a thermal processing plate is performed in a short time, so that the startup operation of a thermal processing unit is speedily performed to raise the operation rate of the unit. In addition, the temperature setting of the thermal processing plate is properly performed, resulting in, for example, increased in-plane uniformity of processing states of the substrate.

BRIEF DESCRIPTION OF THE DRAWINGS

FIG. 10 is an explanatory view showing the contents to calculate an improvable in-plane tendency by adding up improvable in-plane tendency components;

FIG. 11 is an explanatory view showing the contents to calculate an after-improvement improvable tendency by subtracting the improvable in-plane tendency from the in-plane tendency of the current line widths;

FIG. 12 is a determinant showing an example of a calculation model;

FIG. 13 is a flowchart showing a temperature setting process; and

FIG. 14 is a relational expression of the calculation model into which the adjustment amounts for each in-plane tendency and temperature correction values are substituted.

DETAILED DESCRIPTION OF THE INVENTION

Figure 1:
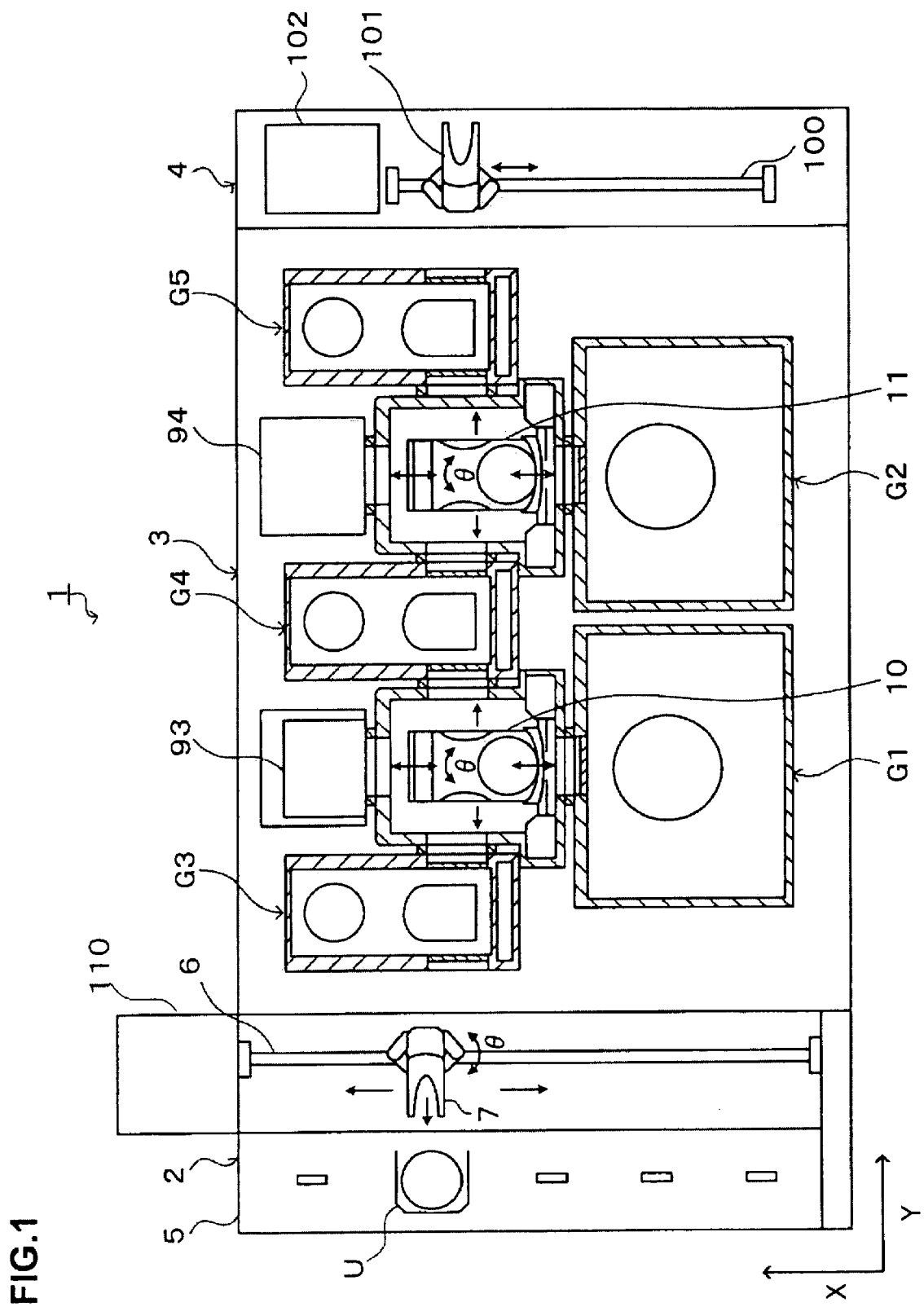
FIG. 1 is a plan view showing the outline of a configuration of a coating and developing treatment system.
Figure 2:
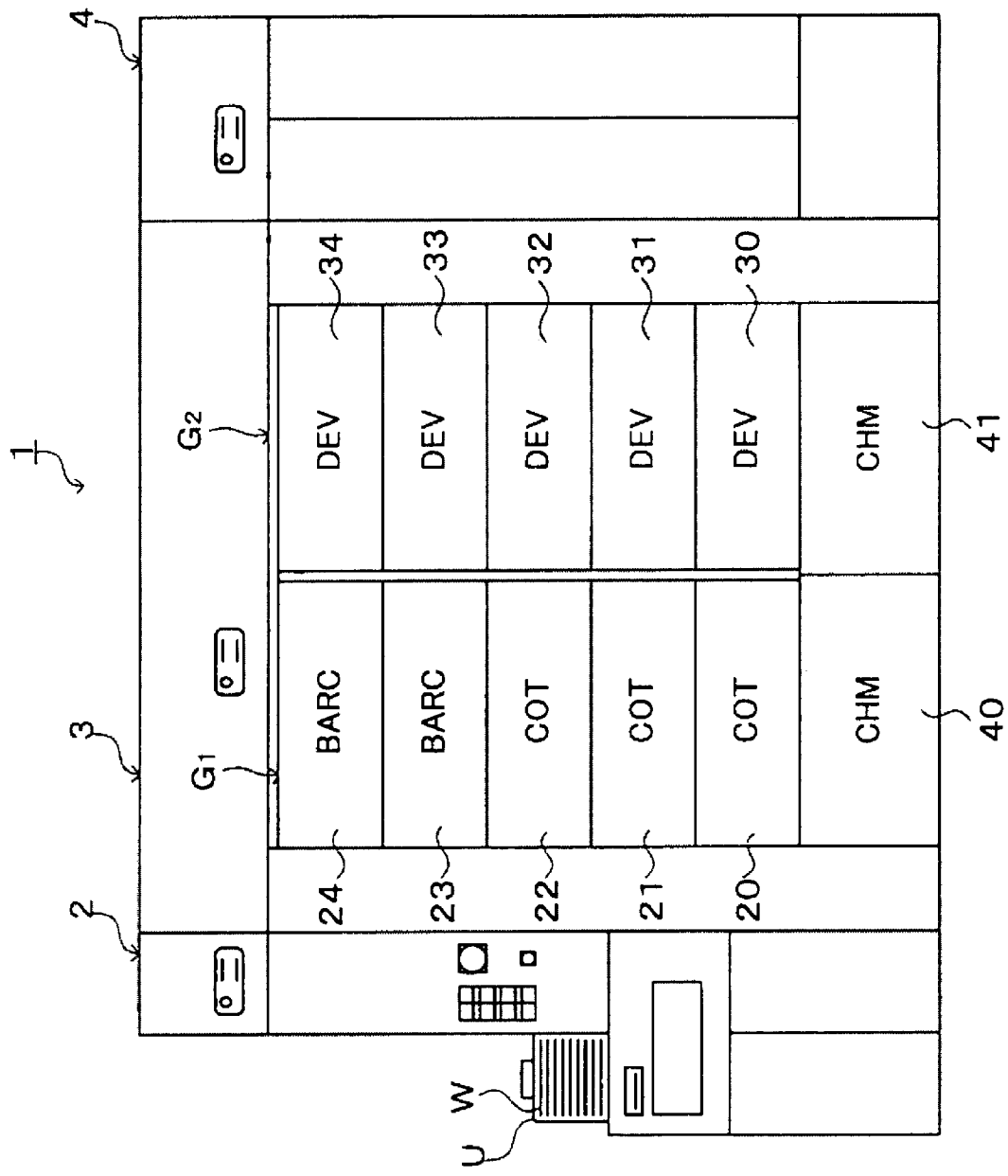
FIG. 2 is a front view of the coating and developing treatment system in FIG. 1.
Figure 3:
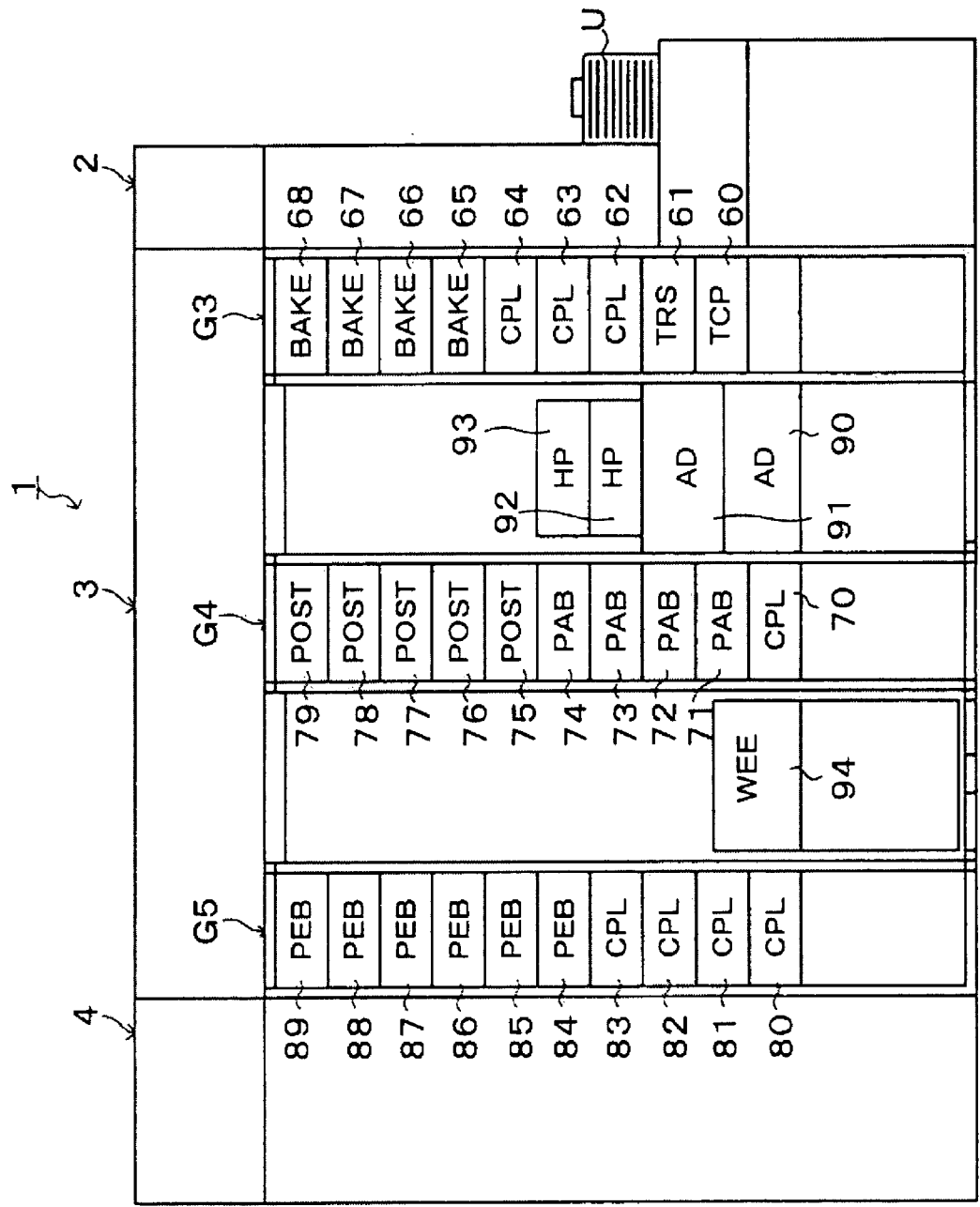
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 incorporating a temperature setting apparatus for a thermal processing plate according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette U; a processing station 3 including a plurality of various kinds of processing and treatment units, which are multi-tiered, each for performing predetermined processing or treatment in a manner of single wafer processing in the photolithography process; and an interface section 4 for delivering the wafers W to/from a not-shown aligner provided adjacent to the processing station 3, are integrally connected together.

In the cassette station 2, a cassette mounting table 5 is provided and configured such that a plurality of cassettes U can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in an arrangement direction of the wafers W housed in the cassette U (a Z-direction; the vertical direction), and thus can selectively access the wafers W in each of the cassettes U arranged in the X-direction.

The wafer transfer body 7 is rotatable in a θ-direction around a Z-axis, and can access a temperature regulating unit 60 and a transition unit 61 included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided. The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light during exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for regulating the wafer temperature under a high precision temperature control, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for thermally processing the wafer W, for example, high-precision temperature regulating units 80 to 83, and post-exposure baking units (hereinafter, referred to as "PEB units") 84 to 89 each for heat-processing the wafer W after exposure and before development, are ten-tiered in order from the bottom.

As shown in FIG. 1, on the positive direction side in the X-direction to the first transfer unit 10, a plurality of processing and treatment units are arranged, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive side in the X-direction to the second transfer unit 11, for example, an edge exposure unit 94 is disposed which selectively exposes only the edge portion of the wafer W to light.

In the interface section 4, for example, a wafer transfer body 101 moving on a transfer path 100 extending in the X-direction and a buffer cassette 102 are provided as shown in FIG. 1. The wafer transfer body 101 is movable in the vertical direction and also rotatable in the θ-direction, and thus can access the not-shown aligner adjacent to the interface section 4, the buffer cassette 102, and the fifth processing unit group G5 and transfer the wafer W to them.

Figure 4:
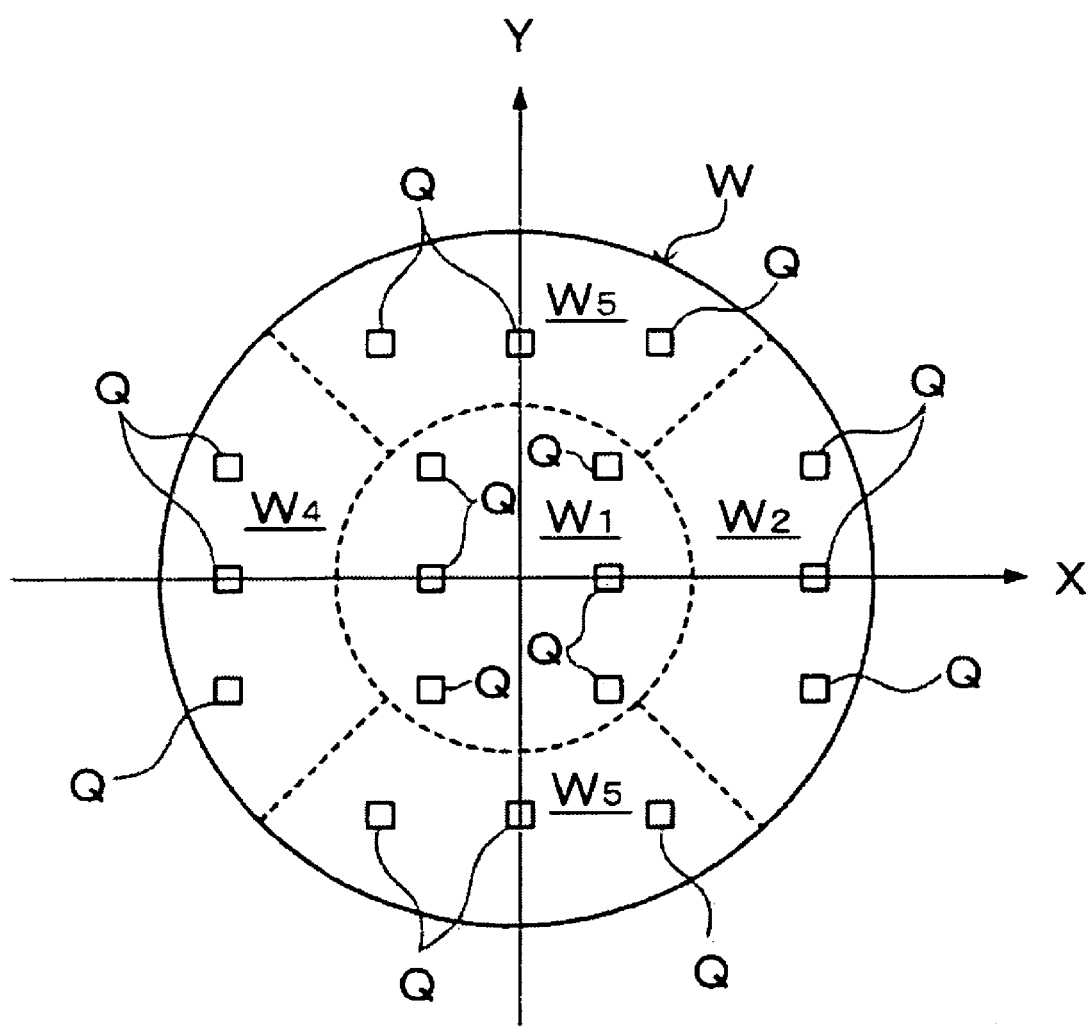
FIG. 4 is an explanatory view showing measurement points of the line widths within a wafer.

In the cassette station 2, for example, a line width measuring unit 110 for measuring the line width of a resist pattern on the wafer W is provided. The line width measuring unit 110 can apply, for example, electron beams to the wafer W and capture the image of the surface of the wafer W to measure the line width of the resist pattern within the wafer. The line width measuring unit 110 can measure the line widths at a plurality of locations within the wafer W. The line width measuring unit 110 can measure, for example, the line widths at a plurality of measurement points Q for each of wafer regions $W_1$ to $W_5$ made by dividing the wafer W into a plurality of regions as shown in FIG. 4. The wafer regions $W_1$ to $W_5$ correspond to thermal plate regions $R_1$ to $R_5$ of a later-described thermal plate 140 of the PEB unit 84.

In the coating and developing treatment system 1 configured as described above, the following wafer processing in the photolithography process is performed.

The unprocessed wafers W are first taken out by the wafer transfer body 7 one by one from the cassette U on the cassette mounting table 5, and transferred to the temperature regulating unit 60 in the third processing unit group G3. The wafer W transferred to the temperature regulating unit 60 is temperature-regulated to a predetermined temperature, and is then transferred by the first transfer unit 10 to the bottom coating unit 23 where an anti-reflection film is formed. The wafer W having the anti-reflection film formed thereon is transferred by the first transfer unit 10 to the heating unit 92, the high-temperature thermal processing unit 65, and the high-precision temperature regulating unit 70 in sequence so that predetermined processing is performed in each of the units.

Thereafter, the wafer W is transferred to the resist coating unit 20, where a resist film is formed on the wafer W, and then transferred by the first transfer unit 10 to the pre-baking unit 71 and subjected to pre-baking. The wafer is subsequently transferred by the second transfer unit 11 to the edge exposure unit 94 and the high-precision temperature regulating unit 83 in sequence so that the wafer W is subjected to predetermined processing in each of the units. The wafer W is then transferred by the wafer transfer body 101 in the interface section 4 to the not-shown aligner, where the wafer is exposed to light.

The wafer W for which exposure processing has been finished is transferred by the wafer transfer body 101, for example, to the PEB unit 84, where the wafer W is subjected to post-exposure baking processing, and then transferred by the second transfer unit 11 to the high-precision temperature regulating unit 81, where the wafer W is temperature-regulated. The wafer W is transferred to the developing treatment unit 30, where the resist film on the wafer W is developed. The wafer W is then transferred by the second transfer unit 11 to the post-baking unit 75, where the wafer W is subjected to post-baking. The wafer W is then transferred to the high-precision temperature regulating unit 63, where the wafer W is temperature-regulated. The wafer W is then transferred by the first transfer unit 10 to the transition unit 61 and returned to the cassette U by the wafer transfer body 7, thus completing the photolithography process being a series of wafer processing.

Figure 5:
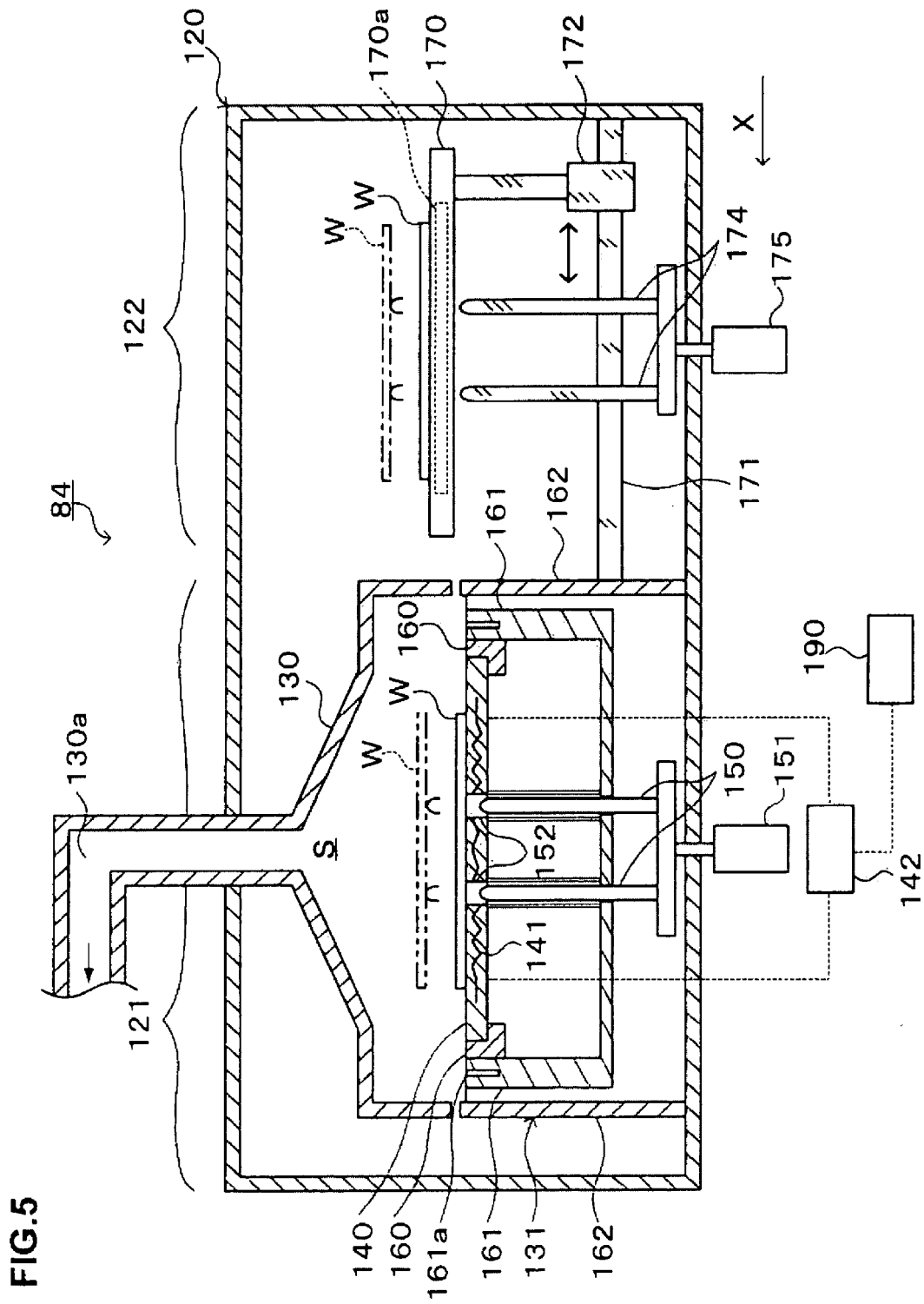
FIG. 5 is an explanatory view of a longitudinal section showing the outline of a configuration of a PEB unit.
Figure 6:
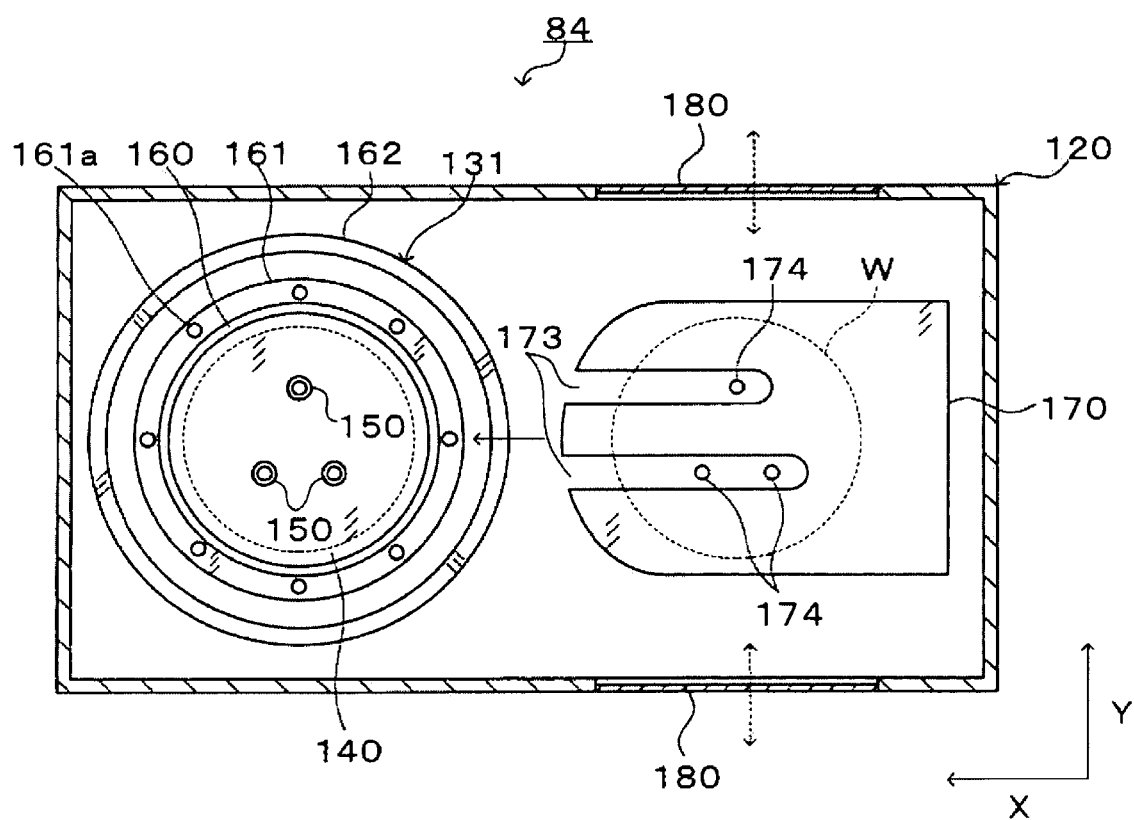
FIG. 6 is an explanatory view of a transverse section showing the outline of the configuration of the PEB unit.

Next, the configuration of the aforementioned PEB unit 84 will be described. As shown in FIG. 5 and FIG. 6, the PEB unit 84 comprises a heating section 121 for heat-processing the wafer W and a cooling section 122 for cooling the wafer W in a housing 120.

The heating section 121 has, as shown in FIG. 5, a lid body 130 that is located on the upper side and vertically movable, and a thermal plate accommodating unit 131 that is located on the lower side and forms a processing chamber S together with the lid body 130.

The lid body 130 has an almost conical shape gradually increasing in height toward its central portion, and is provided with an exhaust portion 130a at its top portion. The atmosphere in the processing chamber S is uniformly exhausted through the exhaust portion 130a.

At the center of the thermal plate accommodating unit 131, a thermal plate 140 is provided as a thermal processing plate for mounting and heating the wafer W thereon. The thermal plate 140 has an almost disk shape with a large thickness.

Figure 7:
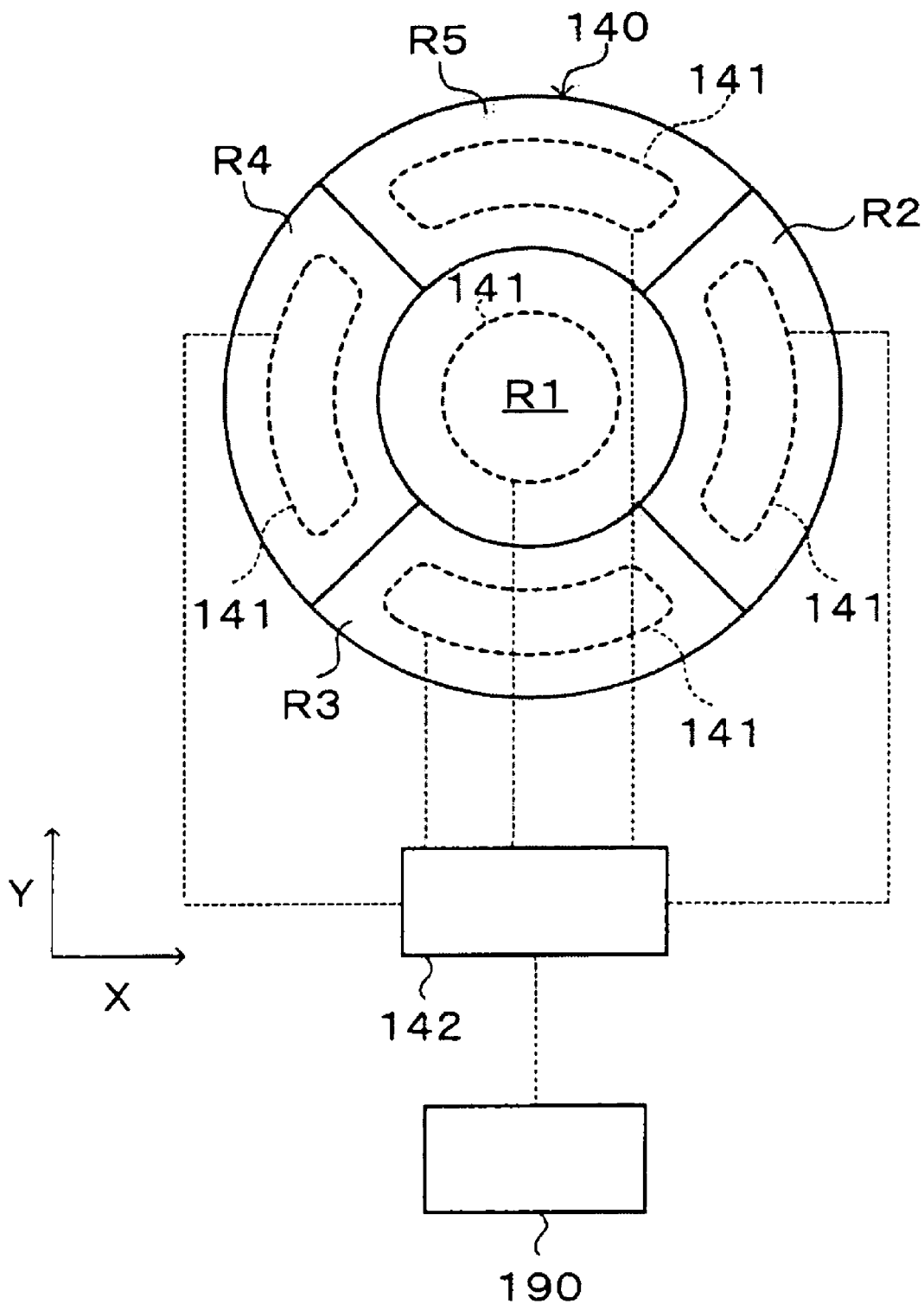
FIG. 7 is a plan view showing a configuration of a thermal plate in the PEB unit.

The thermal plate 140 is divided into a plurality of, for example, five thermal plate regions $R_1$, $R_2$, $R_3$, $R_4$ and $R_5$ as shown in FIG. 7. The thermal plate 140 is divided, for example, into the circular thermal plate region $R_1$ which is located at the central portion as seen in plan view and the thermal plate regions $R_2$ to $R_5$ which are made by equally dividing the peripheral portion around the thermal plate region $R_1$ into four sectors.

A heater 141 generating heat by power feeding is individually embedded in each of the thermal plate regions $R_1$ to $R_5$ of the thermal plate 140 and can heat each of the thermal plate regions $R_1$ to $R_5$. The heating value of each of the heaters 141 of the thermal plate regions $R_1$ to $R_5$ is adjusted, for example, by a temperature controller 142. The temperature controller 142 can adjust the heating value of the heater 141 to control the temperature of each of the thermal plate regions $R_1$ to $R_5$ to a predetermined set temperature. The temperature setting in the temperature controller 142 is performed, for example, by a later-described temperature setting apparatus 190.

As shown in FIG. 5, first raising and lowering pins 150 for supporting the wafer W from below and raising and lowering the wafer W are provided below the thermal plate 140. The first raising and lowering pins 150 are vertically movable by means of a raising and lowering drive mechanism 151. Near the central portion of the thermal plate 140, through holes 152 are formed which pass through the thermal plate 140 in its thickness direction. The first raising and lowering pins 150 can rise from below the thermal plate 140 and pass through the through holes 152 to project to above the thermal plate 140 so as to support the wafer W.

The thermal plate accommodating unit 131 has an annular holding member 160 for accommodating the thermal plate 140 and holding the outer peripheral portion of the thermal plate 140, and a support ring 161 almost in a cylindrical shape surrounding the outer periphery of the holding member 160. The upper surface of the support ring 161 is formed with blow ports 161a for jetting, for example, an inert gas toward the inside of the processing chamber S. The jetting of the inert gas from the blow ports 161a can purge the processing chamber S. Further, outside the support ring 161, a case 162 in a cylindrical shape is provided which is an outer periphery of the thermal plate accommodating unit 131.

In the cooling section 122 adjacent to the heating section 121, for example, a cooling plate 170 is provided which mounts and cools the wafer W thereon. The cooling plate 170 has, for example, an almost square flat-plate shape as shown in FIG. 6 with its end face on the heating section 121 side curved in an arc shape. As shown in FIG. 5, inside the cooling plate 170, for example, a cooling member 170a such as a Peltier element is embedded and can adjust the cooling plate 170 to a predetermined set temperature.

The cooling plate 170 is attached to a rail 171 extending toward the heating section 121 side. The cooling plate 170 can move on the rail 171 by means of a drive unit 172 to a position above the thermal plate 140 on the heating section 121 side.

The cooling plate 170 is formed with, for example, two slits 173 along the X-direction, for example, as shown in FIG. 6. The slits 173 are formed from the end surface on the heating section 121 side of the cooling plate 170 to the vicinity of the central portion of the cooling plate 170. The slits 173 prevent the cooling plate 170 which has moved to the heating section 121 side from interfering with the first raising and lowering pins 150 projecting to above the thermal plate 140. As shown in FIG. 5, second raising and lowering pins 174 are provided below the cooling plate 170 in the cooling section 122. The second raising and lowering pins 174 can be raised and lowered by a raising and lowering drive unit 175. The second raising and lowering pins 174 can rise from below the cooling plate 170 and pass through the slits 173 to project to above the cooling plate 170 so as to support the wafer W.

As shown in FIG. 6, both side surfaces of the housing 120 across the cooling plate 170 are formed with transfer-in/out ports 180 for transferring-in/out the wafer W.

In the PEB unit 84 configured as described above, a wafer W is first transferred-in through the transfer-in/out port 180 and mounted on the cooling plate 170. The cooling plate 170 is subsequently moved so that the wafer W is moved to a position above the thermal plate 140. The wafer W is mounted onto the thermal plate 140 by the first raising and lowering pins 150, so that the wafer W is heated. After a lapse of a predetermined time, the wafer W is then passed from the thermal plate 140 again to the cooling plate 170 and cooled thereon, and transferred from the cooling plate 170 to the outside of the PEB unit 84 through the transfer-in/out port 180, with which a series of thermal processing ends.

Next, the configuration of the temperature setting apparatus 190 for performing temperature setting of the thermal plate 140 in the above-described PEB unit 84 will be described. The temperature setting apparatus 190 is composed of, for example, a general-purpose computer comprising a CPU and a memory, and connected to the temperature controller 142 for the thermal plate 140 as shown in FIG. 5 and FIG. 7.

Figure 8:
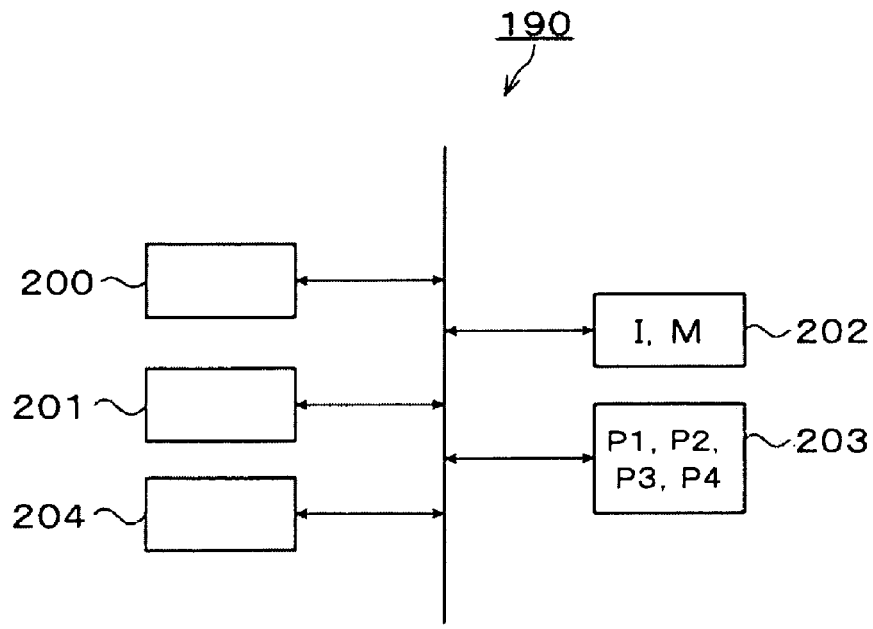
FIG. 8 is a block diagram showing a configuration of a temperature setting apparatus.

The temperature setting apparatus 190 comprises, for example, as shown in FIG. 8, a computing unit 200 for executing various kinds of programs; an input unit 201 for inputting, for example, various kinds of information for temperature setting; a data storage unit 202 for storing various kinds of information for temperature setting; a program storage unit 203 for storing various kinds of programs for temperature setting; and a communication unit 204 for communicating with the temperature controller 142 to change the temperature setting of the thermal plate 140.

Figure 9:
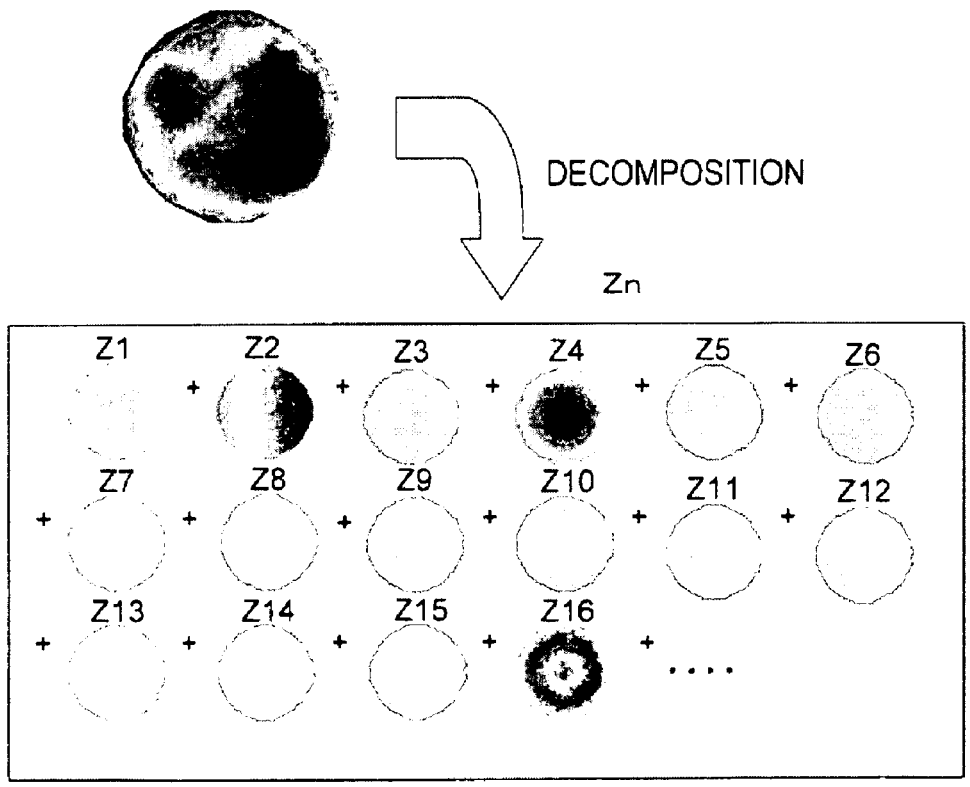
FIG. 9 is an explanatory view showing a state in which the in-plane tendency of the line widths by the line width measurements is decomposed into a plurality of in-plane tendency components using a Zernike polynomial.

The program storage unit 203 stores, for example, a program P1 to calculate, from line width measured values of the resist pattern within the wafer, a plurality of in-plane tendency components Zn expressing a decomposed in-plane tendency of the measured line widths. The plurality of in-plane tendency components Zn (where n is a natural number equal to or greater than 1) are expressed by decomposing the in-plane tendency Z of the measured line widths within the wafer into a plurality of components using a Zernike polynomial as shown in FIG. 9.

Adding explanation about the Zernike polynomial, the Zernike polynomial is a complex function on a unit circle with a radius of 1 (practically used as a real function) which is often used in the optical field, and has arguments (r, θ) of polar coordinates. The Zernike polynomial is mainly used to analyze the aberration component of a lens in the optical field, and the wavefront aberration is decomposed using the Zernike polynomial, whereby aberration components based on the shape of each independent wavefront, for example, a mount shape, a saddle shape, or the like can be known.

In this embodiment, the line width measured values at many points within the wafer are expressed in the height direction above the wafer surface so that the line width tendency within the wafer is grasped as a circular wavefront. The Zernike polynomial is then used to decompose the in-plane tendency Z of the measured line widths within the wafer, for example, into a plurality of in-plane tendency components Zn, such as a deviation component in the Z-direction being the vertical direction, a gradient component in the X-direction, a gradient component in the Y-direction, and a curvature component convexly curving or concavely curving. The magnitude of each of the in-plane tendency components Zn can be expressed by the Zernike coefficients.

The Zernike coefficient indicating each of the in-plane tendency components Zn can be specifically expressed by the following expressions using the arguments (r, θ) of polar coordinates.

Z1 (1)

Z2 (r·cos θ)

Z3 (r·sin θ)

Z4 (2r²−1)

Z5 (r²·cos 2θ)

Z6 (r²·sin 2θ)

Z7 ((3r³−2r)·cos θ)

Z8 ((3r³−2r)·sin θ)

Z9 (6r⁴−6r²+1)

Z10 (r³·cos 3θ)

Z11 (r³·sin 3θ)

Z12 ((4r⁴−3r²)·cos 2θ)

Z13 ((4r⁴−3r²)·sin 2θ)

Z14 ((10r⁵−12r³+3r)·cos θ)

Z15 ((10r⁵−12r³+3r)·sin θ)

Z16 (20r⁶−30r⁴+12r²−1)

and so on.

The Zernike coefficient Z1 indicates the line width average value within the wafer (the deviation component in the Z-direction), the Zernike coefficient Z2 indicates the gradient component in the X-direction, the Zernike coefficient Z3 indicates the gradient component in the Y-direction, and the Zernike coefficients Z4, Z9, and Z16 indicate the curvature components in this embodiment.

The data storage unit 202 stores, for example, Zernike coefficient number information I of the in-plane tendency components improvable (variable) by the setting, for example, of the temperature correction values for the thermal plate regions $R_1$ to $R_5$ as shown in FIG. 8. A method of identifying the improvable in-plane tendency components will be described later.

The program storage unit 203 stores, as shown in FIG. 10, for example, a program P2 to calculate an improvable in-plane tendency Za in the measured line widths by adding up improvable in-plane tendency components of the in-plane tendency components Zn decomposed from the line width measured values. Note that the various kinds of programs for embodying the temperature setting process by the temperature setting apparatus 190 may be ones recorded on a recording medium such as a computer-readable CD, MO, or various flash memories and installed from the recording medium into the temperature setting apparatus 190.

The program storage unit 203 stores, as shown in FIG. 11, for example, a program P3 to calculate an after-improvement in-plane tendency Zf by subtracting the improvable in-plane tendency Za from the in-plane tendency Z of the current measured line widths.

The program storage unit 203 also stores a program P4 to calculate a temperature correction value ΔT to bring each of the in-plane tendency components of the improvable in-plane tendency Za to zero, for example, from the following relation expression (1)

$$\Delta Z = M \cdot \Delta T \quad (1)$$

The calculation model M of the relation expression (1) is a correlation matrix indicating the correlation between the variation amount ΔZ of each in-plane tendency component of the line width within the wafer (the change amount ΔZ of each Zernike coefficient) and the temperature correction value ΔT. Specifically, the calculation model M is a determinant of n (the number of in-plane tendency components) rows by m (the number of thermal plate regions) columns expressed using the Zernike coefficients on a specific condition, for example, as shown in FIG. 12.

The calculation model M is made by raising the temperature of each of the thermal plate regions $R_1$ to $R_5$ in sequence by 1° C., measuring the line width variation amounts within the wafer in each case, calculating the variation amounts of the Zernike coefficients (the variation amounts of the in-plane tendency components) corresponding to the variation amounts of the line widths within the wafer, and expressing the variation amounts of the Zernike coefficients per unit temperature variation as elements $M_{i,j}$ of the determinant ($1 \leq i \leq n$, and $1 \leq j \leq m$ (m=5 in this embodiment)). Note that the in-plane tendency component that does not vary even when the temperature of the thermal plate region is raised by 1° C. creates a variation amount of the Zernike coefficient of 0 (zero), so that the element corresponding to that is 0 (zero).

The relational expression (1) is expressing by the following expression (2) by multiplying both sides of the relational expression (1) by an inverse matrix $M^{-1}$ of the calculation model M.

$$\Delta T = M^{-1} \cdot \Delta Z \quad (2)$$

To bring each of the in-plane tendency components of the improvable in-plane tendency Za to 0 (zero), a value obtained by multiplying each of the in-plane tendency components of the improvable in-plane tendency Za by −1 and the other unimprovable in-plane tendency components which are brought to zero are inputted into the change amount ΔZ of the in-plane tendency.

Next, the temperature setting process by the temperature setting apparatus 190 configured as described above will be described. FIG. 13 shows a flow of the temperature setting process.

First of all, as preparation, the in-plane tendency components of the improvable in-plane tendency Za are identified. This identification is performed by varying the temperature of each of the thermal plate regions $R_1$ to $R_5$ of the thermal plate 140 and measuring the in-plane tendency of the line width in each case. The measured in-plane tendency in each case is decomposed using the Zernike polynomial, so that the in-plane tendency components varying due to variation of the thermal plate regions $R_1$ to $R_5$ are regarded as improvable in-plane tendency components. The Zernike coefficient number information I of the improvable in-plane tendency components is stored in the data storage unit 202.

Next, the wafer W for which a series of photolithography process has been finished in the coating and developing treatment system 1 is transferred into the line width measuring unit 110, where the line width of the resist pattern on the wafer W is measured (Step S1 in FIG. 13). In this event, the line widths at a plurality of measurement points Q within the wafer are measured to obtain the line widths in the wafer regions $W_1$ to $W_5$ corresponding to the thermal plate regions $R_1$ to $R_5$ of the thermal plate 140.

Subsequently, the result of the line width measurement in the line width measuring unit 110 is outputted to the temperature setting apparatus 190. In the temperature setting apparatus 190, for example, from measured values of the line widths in the wafer regions $W_1$ to $W_5$, that is, the measured values of the line widths within the wafer, the plurality of in-plane tendency components Zn made by decomposing the in-plane tendency Z are calculated using the Zernike polynomial (Step S2 in FIG. 13). The measured in-plane tendency Z within the wafer is decomposed into the plurality in-plane tendency components Zn as shown in FIG. 9.

Subsequently, improvable in-plane tendency components $Za_i$ obtained in advance are extracted from the plurality of in-plane tendency components Zn as shown in FIG. 10 and added together. Thus, the improvable in-plane tendency Za in the measured line widths is calculated (Step S3 in FIG. 13).

Then, the improvable in-plane tendency Za is subtracted from the in-plane tendency Z of the current line width measured values as shown in FIG. 11 to obtain an optimal after-improvement in-plane tendency Zf (Step S4 in FIG. 13).

When the temperature correction values ΔT are set with the optimal in-plane tendency Zf as a target, a value obtained by multiplying each of the in-plane tendency components $Za_i$ of the improvable in-plane tendency Za by −1 is substituted into ΔZ of the relational expression (2) as shown in FIG. 14. For the unimprovable in-plane tendency component, 0 (zero) is substituted. This obtains the temperature correction values $\Delta T_1$ to $\Delta T_5$ to bring each of the components $Za_i$ to 0 of the improvable in-plane tendency Za (Step S5 in FIG. 13).

Thereafter, the information of each of the temperature correction values $\Delta T_1$ to $\Delta T_5$ is outputted from the communication unit 204 to the temperature controller 142, and the temperature correction values for the thermal plate regions $R_1$ to $R_5$ of the thermal plate 140 in the temperature controller 142 are changed, whereby new set temperatures are set (Step S6 in FIG. 13).

Note that the temperature setting process is realized, for example, by executing the various kinds of programs stored in the program storage unit 203 of the temperature setting apparatus 190.

According to the above embodiment, the plurality of in-plane tendency components Zn are calculated from the current line width measurement result using the Zernike, and the improvable in-plane tendency components of the plurality of the in-plane tendency components Zn are added together to calculate the improvable in-plane tendency Za of the current processing state. Then, the improvable in-plane tendency Za can be subtracted from the in-plane tendency Z of the current line width to calculate an after-improvement in-plane tendency Zf.

This allows recognition of the optimal in-plane tendency Zf to which improvement can be maximally performed by setting the temperature correction values ΔT for the thermal plate regions $R_1$ to $R_5$, so that the temperature of the thermal plate 140 can be set with the optimal in-plane tendency Zf as a target, thus decreasing the time required for the temperature setting as compared to that in the prior art. Further, since the optimal in-plane tendency Zf is known, the in-plane tendency of the line widths after adjustment can be made uniform into a fixed state irrespective of the level of skill of the operator.

Further, since the relational expression (1) is used to calculate the temperature correction values ΔT to bring each of the in-plane tendency components $Za_i$ of the improvable in-plane tendency Za calculated from the line width measured values to 0 (zero) and the temperature of the thermal plate 140 is set using temperature correction values ΔT, the line width in-plane tendency close to the optimal in-plane tendency Zf can be obtained after temperature correction. Accordingly, a more uniform line width with less in-plane tendency can be formed. Particularly, since the PEB unit 84 greatly affects the final line width, the effect by correcting the temperature of the thermal plate 140 of the PEB unit 84 by the method is profound.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention.

For example, while the temperature-set thermal plate 140 is divided into five regions in the above embodiment, any number of divisions can be selected. The shapes of the divided regions of the thermal plate 140 can also be arbitrarily selected.

While the above embodiment is an example in which the temperature setting of the thermal plate 140 of the PEB unit 84 is performed based on the line widths within the wafer, the present invention is also applicable to a case when performing temperature setting of a thermal plate for performing other thermal processing provided in a pre-baking unit and a post-baking unit, and temperature setting of a cooling plate in a cooling processing unit for cooling the wafer W.

While the temperature setting of the thermal plate is performed to make the line width uniform within the wafer in the above embodiment, the temperature setting of one thermal processing plate in the PEB unit, pre-baking unit, or post-baking unit so as to uniform the processing state other than the line width within the wafer, such as the angle of the side wall in the groove of the resist pattern (the side wall angle) or the film thickness of the resist pattern within the wafer.

Further, while the temperature setting of the thermal plate is performed to uniform the line width of a pattern after the photolithography process and before the etching process in the above embodiment, the temperature setting of each thermal processing plate may be performed so as to uniform the line width or the side wall angle of the pattern after the etching process. Furthermore, the present invention is also applicable to temperature setting of a thermal processing plate for thermally processing substrates other than the wafer, such as an FPD (Flat Panel Display), a mask reticle for a photomask, and the like.

The present invention is useful in setting the temperature of a thermal processing plate for mounting and thermally processing a substrate thereon.

What is claimed is:

1. A temperature setting method of a thermal processing plate for mounting and thermally processing a substrate thereon, said method comprising the steps of:

dividing the thermal processing plate into a plurality of regions within a thermal processing chamber;

setting a temperature for each of the regions with a controllable heater; and adjusting an in-plane temperature of the thermal processing plate by setting a temperature correction value for each of the regions of the thermal processing plate, said adjusting step comprising the steps of:

decomposing an in-plane tendency of current line widths of a resist pattern within a substrate for which a series of substrate processing including the thermal processing has been finished into a plurality of in-plane tendency components using a Zernike polynomial, said line widths being defined along a thickness direction of the substrate, the in-plane tendency being a line width of the resist pattern at a plurality of points in the thickness direction within the substrate;

calculating an improvable in-plane tendency of the line widths of the substrate by adding up in-plane tendency components improvable by setting the temperature correction values for the regions of the plurality of in-plane tendency components; and calculating an in-plane tendency of the line widths after improvement by subtracting the improvable in-plane tendency from the in-plane tendency of the current line widths.

2. The temperature setting method of a thermal processing plate as set forth in claim 1, further comprising:

calculating the temperature correction values for the regions of the thermal processing plate to bring the improvable in-plane tendency components to zero, and setting temperatures of the regions using the temperature correction values.

3. The temperature setting method of a thermal processing plate as set forth in claim 1, further comprising:

identifying the improvable in-plane tendency components by varying the temperature of each of the regions of the thermal processing plate, and identifying in-plane tendency components varying due to the temperature variation using Zernike coefficients of the Zernike polynomial.

4. The temperature setting method of a thermal processing plate as set forth in claim 1, wherein the series of substrate processing forms the resist pattern on the substrate in a photolithography process.

5. The temperature setting method of a thermal processing plate as set forth in claim 4, wherein the thermal processing includes heating processing performed after exposure processing and before a developing treatment.

6. A temperature setting apparatus for a thermal processing plate for mounting and thermally processing a substrate thereon, the apparatus comprising:

the thermal processing plate divided into a plurality of regions, a temperature being settable for each of the regions, and a temperature correction value for adjusting an in-plane temperature of the thermal processing plate being settable for each of the regions of the thermal processing plate; and a controller for decomposing an in-plane tendency of current line widths of a resist pattern within the substrate for which a series of substrate processing including the thermal processing has been finished, into a plurality of in-plane tendency components using a Zernike polynomial, said line widths being defined along a thickness direction of the substrate, the in-plane tendency being a line width of the resist pattern at a plurality of points in the thickness direction within the substrate., wherein the controller calculates an improvable in-plane tendency of the line widths of the substrate by adding up in-plane tendency components improvable by setting the temperature correction values for the regions of the plurality of in-plane tendency components, and the controller calculates an in-plane tendency of the line widths after improvement by subtracting the improvable in-plane tendency from the in-plane tendency of the current line widths.

7. The temperature setting apparatus for a thermal processing plate as set forth in claim 6, wherein said controller calculates the temperature correction values for the regions of the thermal processing plate to bring the improvable in-plane tendency components to zero, and sets temperatures of the regions using the temperature correction values.

8. The temperature setting apparatus for a thermal processing plate as set forth in claim 6, wherein the series of substrate processing forms the resist pattern on the substrate in a photolithography process.

9. The temperature setting apparatus for a thermal processing plate as set forth in claim 8, wherein the thermal processing includes heating processing performed after exposure processing and before a developing treatment.

* * * * *